(12) United States Patent
Zhang et al.

(10) Patent No.: US 9,570,332 B2
(45) Date of Patent: Feb. 14, 2017

(54) REGULATION JIG AND A DISPLAY SUBSTRATE CONVEYER USING THE SAME

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: He Zhang, Beijing (CN); Rong Zhang, Beijing (CN); Hongbin Wang, Beijing (CN); Kai Yin, Beijing (CN); Bingrui Wang, Beijing (CN); Tingzhong Xiong, Beijing (CN); Lei Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/803,664

(22) Filed: Jul. 20, 2015

(65) Prior Publication Data

US 2016/0090241 A1 Mar. 31, 2016

(30) Foreign Application Priority Data

Sep. 26, 2014 (CN) .......................... 2014 1 0505348

(51) Int. Cl.
*B65G 13/06* (2006.01)
*H01L 21/677* (2006.01)

(52) U.S. Cl.
CPC ....... *H01L 21/67706* (2013.01); *B65G 13/065* (2013.01)

(58) Field of Classification Search
CPC ............................ B65G 13/065; H01L 21/677
(Continued)

(56) References Cited

U.S. PATENT DOCUMENTS

| 5,131,937 A | 7/1992 | Kuster et al. |
| 2005/0103601 A1* | 5/2005 | Hubel ................. B65G 21/209 198/780 |

(Continued)

FOREIGN PATENT DOCUMENTS

| CN | 2173249 Y | 8/1994 |
| CN | 2498119 Y | 7/2002 |

(Continued)

OTHER PUBLICATIONS

Office Action for corresponding Chinese application 201410505348.6 dated Dec. 29, 2015 with English translation.

*Primary Examiner* — Mark A Deuble
(74) *Attorney, Agent, or Firm* — Nath, Goldberg & Meyer; Joshua B. Goldberg

(57) ABSTRACT

The invention discloses a regulation jig including a regulation part and a scale plate which are movably connected. The regulation part can simultaneously regulate positions of conveying rings having the same sequence, such that they are arranged into a line. The scale plate can accurately control the distance between the lines formed by the rings. The regulation jig not only can guarantee the straightness of a row of conveying rings around different conveying rollers and having the same sequence, but also can ensure that the transmission surface formed by the conveying rings for supporting and conveying the display substrates has a good flatness, in turn preventing the display substrates from deviating from its travelling direction during the transmission. As such, the regulation jig provided by the invention can efficiently and promptly regulate the positions of the (Continued)

conveying rings, so as to ensure the normal transmission of the display substrate.

20 Claims, 3 Drawing Sheets

(58) Field of Classification Search
USPC .......................................... 198/780, 782, 785
See application file for complete search history.

(56) References Cited

U.S. PATENT DOCUMENTS

| 2013/0092511 A1* | 4/2013 | Liu ....................... C03B 35/163 |
| | | 198/788 |
| 2013/0199896 A1* | 8/2013 | Cheng ............... H01L 21/67265 |
| | | 198/617 |
| 2014/0151194 A1* | 6/2014 | Kim .................. H01L 21/67706 |
| | | 198/780 |

FOREIGN PATENT DOCUMENTS

| CN | 2503038 Y | 7/2002 |
| CN | 1513739 A | 7/2004 |
| CN | 201183190 Y | 1/2009 |
| CN | 201882633 U | 6/2011 |

* cited by examiner

REGULATION JIG AND A DISPLAY SUBSTRATE CONVEYER USING THE SAME

FIELD OF THE INVENTION

The present invention relates to the field of manufacturing technologies of display panel, and in particular to a regulation jig and a display substrate conveyer using the same.

BACKGROUND OF THE INVENTION

In manufacturing process of liquid crystal display (LCD) product, the manufacturing of the display panel includes many processes. Therefore, a conveyer is necessarily used for conveying display substrates.

In the prior art, a plurality of conveying rollers parallel to each other are usually provided. The display substrates may be transferred with the rotation of the conveying rollers. In this case, in order to avoid adverse influences of static electricity and moisture on the display substrates during the rotation of the conveying rollers, each of conveying rollers is usually provided with a plurality of rubber rings. The rubber rings may be rotated with the rotation of the conveying rollers, so as to allow the display substrates placed thereon to be conveyed. Since the rubber rings have good anti-static, water-proof and wear resistant properties, the rubber rings can protect the display substrates well during its transmission, and can prevent the display substrates from being damaged by the static electricity and the moisture.

The conveying rollers and the rubber rings are usually used for horizontally transferring the display substrate. During the horizontal transmission of the display substrates, actions such as position regulation of the display substrates, reading of the identification codes and adherence of the identification labels are necessarily completed on the conveying rollers and the rubber rings. To complete these actions, stop positions of the display substrates during the transmission are required to be highly accurate. Therefore, an offset angle of a transmission surface, which is formed by the rubber rings around the conveying rollers and which is used for supporting and conveying the display substrates, is required to be within 1-3° with respect to horizontal plane, and the fluctuation of flatness of the transmission surface is required to be within 0.2±0.1 mm. That is to say, the horizontal transmission of the display substrates requires the transmission surface, which is formed by the rubber rings and which is used for supporting and conveying the display substrates, to have a relatively high flatness. The flatness of the transmission surface depends on straightness of a row of rubber rings around different conveying rollers and having same sequence. That is to say, from ends at the same side of the conveying rollers, first rubber rings of respective conveying rollers are arranged into a line, second rubber rings of respective conveying rollers are arranged into a line . . . , and nth rubber rings of respective conveying rollers are arranged into a line. The better the straightness of a row of rubber rings having the same sequence is, the better the flatness of the transmission surface is. Meanwhile, the lines, into which the rubber rings are arranged, have to be in parallel with each other, such that the transmission surface can have a good flatness.

In this manner, a great number of rubber rings are provided, and the conveying rollers may apply a centrifugal force to the rubber rings during the rotation, such that the rubber rings may be displaced. Therefore, if a certain rubber ring is displaced too much from the line where it should be, the distribution of the rubber rings on the conveying rollers will be not uniform, such that the display substrates are caused to vibrate during the transmission and in turn to probably deviate from its travelling direction. This position offset is likely to lead to damage of the display substrates during the position regulation. Therefore, positions of the rubber rings are needed to be frequently regulated in the transmission process of the conveying rollers.

In a traditional method of regulating the positions of the rubber rings, the conveying rollers are stopped from rotating, and then the positions of the rubber rings are regulated manually. Or, during the rotation of the conveying rollers, the positions of the rubber rings are regulated by a steel ruler. Since in both of the regulation methods the positions of the rubber rings can be regulated one by one only, the regulation efficiency is very low. Further, it is difficult for manual regulation to accurately control the straightness of a row of rubber rings and to accurately control an interval between rubber rings, so that the flatness of the transmission surface formed by the rubber rings cannot be accurately controlled.

SUMMARY OF THE INVENTION

In order to address above problems in the prior art, the present invention provides a regulation jig and a display substrate conveyer using the same. According to the present invention, the regulation jig not only can guarantee the straightness of a row of conveying rings around different conveying rollers and having the same sequence, but also can ensure that the transmission surface formed by the conveying rings for supporting and conveying the display substrates has a good flatness, in turn preventing the display substrates from deviating from its travelling direction during the transmission. As such, the regulation jig provided by the present invention can efficiently and promptly regulate the positions of the conveying rings, so as to ensure the normal transmission of the display substrate.

As an aspect of the present invention, there is provided a regulation jig used in a conveyer for conveying display substrates, which is capable of regulating conveying rings around the conveying rollers. The regulation jig includes a regulation part and a scale plate, which are movably connected to each other. The regulation part is configured to simultaneously regulate positions of a plurality of conveying rings having the same sequence, such that the conveying rings around different conveying rollers and having the same sequence are arranged into a line. The scale plate is configured to accurately control the distance between the lines, into which the conveying rings are arranged.

Preferably, the regulation part includes a first regulating plate and a second regulating plate which are oppositely arranged to be parallel to each other, outer plate surfaces of the first regulating plate and the second regulating plate are configured to contact with the conveying rings around different conveying rollers and having the same sequence, respectively, and both of the first regulating plate and the second regulating plate are movable in a length direction of the conveying roller.

Preferably, the conveying rollers have the same shape and size and are arranged in parallel at an equal interval, the first regulating plate and the second regulating plate are arranged to be perpendicular to the length direction of the conveying roller, such that their first plate surfaces facing to the conveying rollers are brought into contact with the conveying rollers, and the first plate surfaces is capable of simultaneously contacting with a plurality of conveying rollers.

Preferably, recesses are formed on the first plate surface, and the recesses have the same shape and size, so as to cooperate with the plurality of conveying rollers, respectively.

Preferably, the conveying roller is of a cylindrical shape, the recess is of a semicircular shape, and a diameter of the recess is equal to or slightly larger than that of the conveying roller.

Preferably, the scale plate include a scale plate body, the scale plate body is provided on second plate surfaces of the first regulating plate and the second regulating plate, which are opposite to the first plate surfaces, a length direction of the scale plate body is perpendicular to the first regulating plate and the second regulating plate, the length of the scale plate body in a direction perpendicular to the first regulating plate and the second regulating plate is larger than a sum of thicknesses of the first regulating plate and the second regulating plate, and a top plate surface of the scale plate body is provided with scale extending along its length direction.

Preferably, at least one strip-shaped opening is formed in the scale plate body, the opening being extended along the length direction of the scale plate body, the regulation jig further includes limiting devices, which are provided on the second plate surfaces of the first regulating plate and the second regulating plate, respectively, and penetrate through the opening, and the limiting devices can cooperate with the opening, such that the first regulating plate and the second regulating plate can move in the length direction of the opening with respect to the scale plate body.

Preferably, the limiting device is a screw bolt, which comprises a screw cap and a threaded rod, a diameter of the rod is smaller than a width of the opening, and the width of the opening is smaller than a diameter of the screw cap, such that the scale plate body is kept between the regulation part and the screw cap, and bolt holes are formed on the second plate surface of the first regulating plate and the second regulating plate, to which the rods are fit.

Preferably, the limiting devices include threaded rods which are formed integrally with the first regulating plate and the second regulating plate, respectively, and which can cooperate with nuts, and a diameter of the rod is smaller than a width of the opening, and the width of the opening is smaller than a diameter of the nuts, such that the scale plate body is kept between the regulation part and the nuts.

Preferably, the first regulating plate and the second regulating plate are made of a rubber material.

As another aspect of the present invention, there is provided a display substrate conveyer including the regulation jig as described above.

The regulation jig according to the present invention has following advantages: the regulation part and the scale plate of the regulation jig provided by the present invention can arrange a plurality of conveying rings having the same sequence into a line with one regulation. Therefore, not only can the straightness of a row of conveying rings around different conveying rollers and having the same sequence be guaranteed, but the conveying rings on two adjacent lines (rows) can also be spaced at an equal interval, whereby guaranteeing that the transmission surface formed by the conveying rings for supporting and conveying the display substrates has a good flatness, and in turn preventing the display substrates from deviating from its travelling direction during the transmission. As such, the regulation jig provided by the present invention can efficiently and promptly regulate the positions of the conveying rings, so as to ensure the normal transmission of the display substrate.

With the regulation jig as described above, the display substrate conveyer according to the invention not only can ensure that the transmission surface for supporting and conveying the display substrates has a good flatness, but also can improve the efficiency of transmission.

IN THE REFERENCE NUMERALS

1—conveying roller; 2—conveying ring; 3—regulation part; 31—first regulating plate; 32—second regulating plate; 310—first plate surface; 311—recess; 312—second plate surface; 4—scale plate; 41—scale plate body; 410—opening; 42—limiting device.

DETAILED DESCRIPTION OF THE EMBODIMENTS

In order to make those skilled in the art better understand the technical solutions of the present invention, a regulation jig and a display substrate conveyer using the same according to the present invention will be described in detail below in conjunction with the accompanying drawings and specific embodiments.

Figure 1:
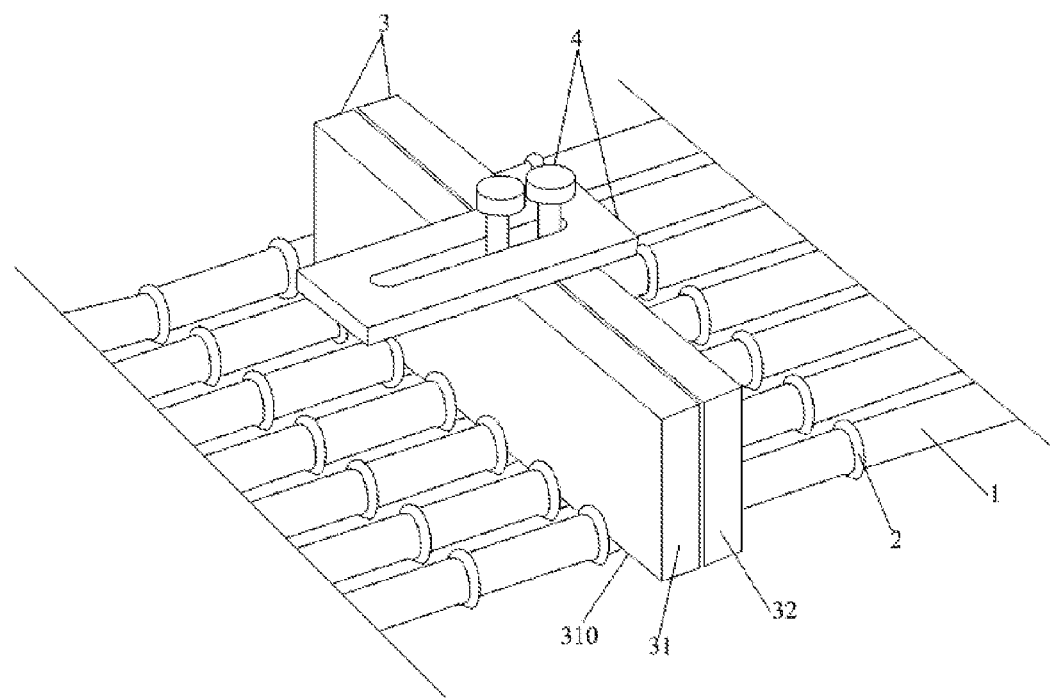
FIG. 1 is a schematic diagram showing a structure of a regulation jig according to the present invention.

As an aspect, the present invention provides a regulation jig used in a conveyer for conveying a display substrate. The regulation jig can regulate conveying rings 2 around conveying rollers 1. As shown in FIG. 1, the regulation jig may include a regulation part 3 and a scale plate 4 which are movably connected to each other. Herein, the regulation part 3 can simultaneously regulate positions of a plurality of conveying rings 2 having the same sequence, such that the conveying rings 2 around different conveying rollers 1 and having the same sequence are arranged into a line. The scale plate 4 is configured to accurately control the distance between the lines, into which the conveying rings 2 are arranged.

The regulation part 3 and the scale plate 4 are provided to simultaneously regulate positions of the plurality of conveying rings 2 having the same sequence, such that the plurality of conveying rings 2 having the same sequence can be arranged into a line with one regulation. Therefore, not only can the straightness of a row of conveying rings 2 around different conveying rollers 1 and having the same sequence be guaranteed, but also the conveying rings 2 on two adjacent lines (rows) can be spaced at an equal interval, whereby guaranteeing that the transmission surface formed by the conveying rings 2 for supporting and conveying the display substrates has a good flatness, and in turn preventing the display substrates from deviating from its travelling direction during the transmission. As such, the regulation jig provided by the present invention can efficiently and promptly regulate the positions of the conveying rings 2, so as to ensure the normal transmission of the display substrate.

It should be noted, the conveying rings 2 around different conveying rollers 1 and having the same sequence, as set forth above, refer to from ends at the same side of the conveying rollers 1, first conveying rings 2 around respective conveying rollers 1, second conveying rings 2 around respective conveying rollers 1 . . . , nth conveying rings 2 around respective conveying rollers 1, wherein a maximum of n is equal to a total number of the conveying rings 2 on each conveying roller 1. In this embodiment, the total number of conveying rings 2 on each conveying roller 1 is the same.

In this embodiment, as shown in FIG. 1, the conveying rollers 1 are arranged to be parallel to each other. The regulation part 3 may include a first regulating plate 31 and a second regulating plate 32 which are oppositely arranged to be parallel to each other. Outer plate surfaces of the first regulating plate 31 and the second regulating plate 32 are brought into contact with the conveying rings 2 around different conveying rollers 1 and having the same sequence, respectively. According to the regulation jig of the present invention, both of the first regulating plate 31 and the second regulating plate 32 can move in a length direction of the conveying roller 1. In such a manner, the conveying rings 2 around different conveying rollers 1 and having the same sequence can be brought into contact with the outer plate surface of the first regulating plate 31 or the second regulating plate 32, such that the conveying rings 2 around different conveying rollers 1 and having the same sequence are arranged into a line along the outer plate surface of the first regulating plate 31 or the second regulating plate 32. In such a manner, the straightness of a row of conveying rings 2 around different conveying rollers 1 and having the same sequence can be ensured.

Herein, the conveying rollers 1 may have the same shape and size and be arranged in parallel at an equal interval. The first regulating plate 31 and the second regulating plate 32 are arranged to be perpendicular to the length direction of the conveying roller 1, such that their first plate surfaces (bottom plate surface) 310 facing to the conveying rollers 1 may be brought into contact with the conveying rollers 1. According to the regulation jig of the present invention, the first plate surfaces 310 can simultaneously contact with a plurality of conveying rollers 1. In such a manner, the first regulating plate 31 or the second regulating plate 32 can simultaneously regulate positions of conveying rings 2 around different conveying rollers 1 and having the same sequence, and the plurality of conveying rings 2 having the same sequence can be all arranged into a line with one regulation. Therefore, the efficiency of regulation can be improved, while the straightness of a row of conveying rings 2 having the same sequence can be guaranteed.

It should be noted, the first plate surface 310 may be simultaneously brought into contact with all of the conveying rollers 1; alternatively, the first plate surface 310 may be simultaneously brought into contact with some of the conveying rollers 1. Accordingly, the first regulating plate 31 or the second regulating plate 32 may regulate all of the conveying rings 2 around the conveying rollers 1 and having the same sequence at one time, or may regulate only some of the conveying rings 2 having the same sequence and then regulate many times so that the conveying rings 2 around the conveying rollers 1 and having the same sequence are arranged into a line. Compared to the prior art, whether once regulation or multiple regulations, the efficiency of regulation can be greatly improved, while the straightness of a row of conveying rings 2 having the same sequence can be guaranteed.

Figure 2:
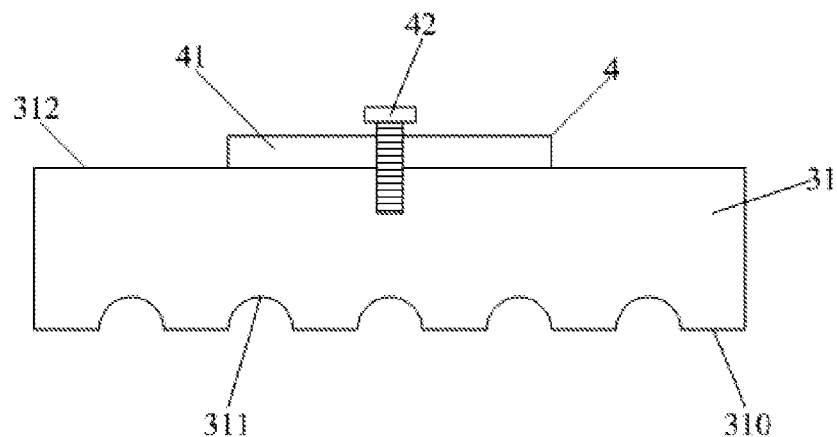
FIG. 2 is a sectional view of a first regulating plate or a second regulating plate of the regulation jig as shown in FIG. 1 taken along the length of the plate.

In this embodiment, as shown in FIG. 2, a plurality of recesses 311 may be formed on the first plate surface 310. Preferably, the plurality of recesses 311 have the same shape and size, so as to cooperate with the plurality of conveying rollers 1, respectively. In such a manner, the first regulating plate 31 and the second regulating plate 32 may use the conveying rollers 1 as rails to move in the length direction of the conveying roller 1, so as to facilitate the regulation of the positions of the conveying rings 2.

In this embodiment, the conveying roller 1 is of a cylindrical shape, while the recess 311 is of a semicircular shape. Preferably, a diameter of the recess 311 is equal to or slightly larger than that of the conveying roller 1. As a result, the first regulating plate 31 and the second regulating plate 32 can smoothly move in the length direction of the conveying roller 1, so as to facilitate the regulation of the positions of the conveying rings 2 and improve the efficiency of regulation.

Figure 3:
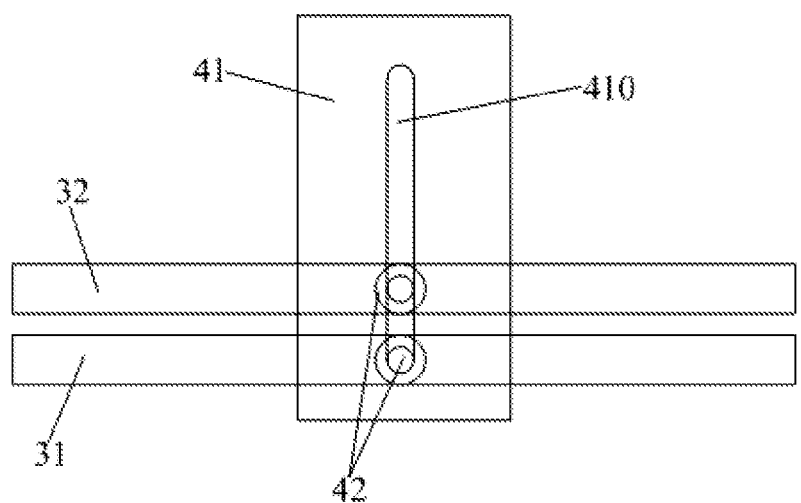
FIG. 3 is a top view of the regulation jig as shown in FIG. 1.
Figure 4:
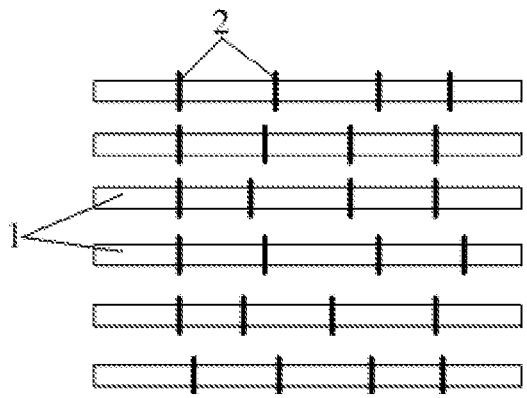
FIG. 4 is a schematic diagram showing conveying rings around conveying rollers before position regulation.
Figure 5:
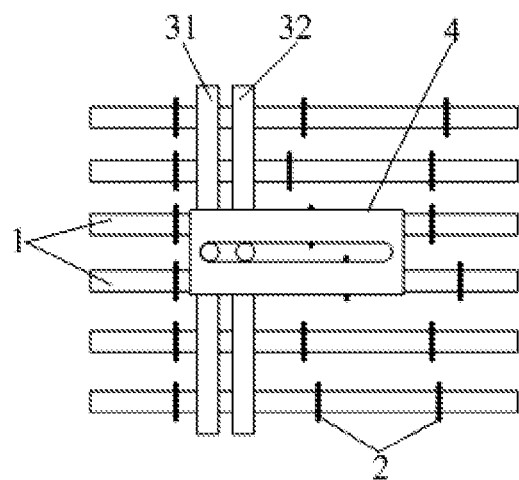
FIG. 5 is a top view of the conveying rollers on which the regulation jig as shown in FIG. 1 is mounted.
Figure 6:
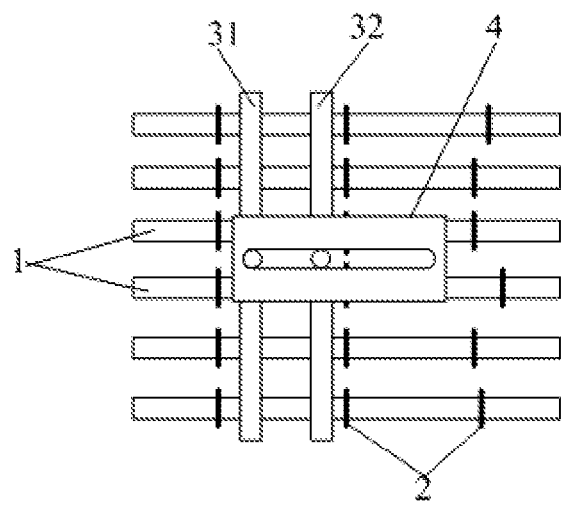
FIG. 6 is a schematic top view showing conveying rings in a process of position regulation by the regulation jig as shown in FIG. 1.
Figure 7:
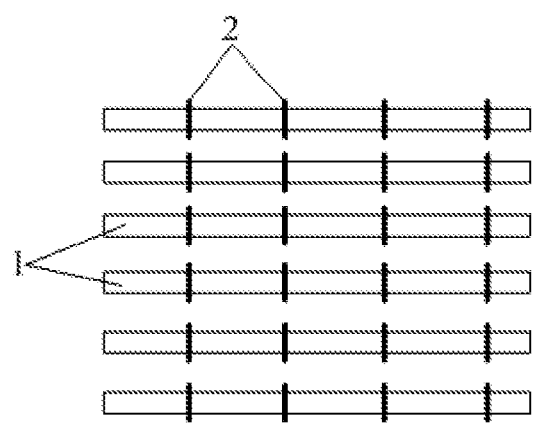
FIG. 7 is a schematic top view showing conveying rings around conveying rollers after position regulation by the regulation jig as shown in FIG. 1.

In this embodiment, as shown in FIGS. 1 and 3, the scale plate 4 may include a scale plate body 41. The scale plate body 41 is provided on second plate surfaces (top plate surfaces) 312 of the first regulating plate 31 and the second regulating plate 32, which are opposite to the first plate surfaces 310. Preferably, the scale plate body 41 is of a rectangular shape. Preferably, a length direction of the scale plate body 41 is perpendicular to the first regulating plate 31 and the second regulating plate 32. Preferably, the length of the scale plate body 41 in a direction perpendicular to the first regulating plate 31 and the second regulating plate 32 is larger than a sum of thicknesses of the first regulating plate 31 and the second regulating plate 32. In addition, the top plate surface of the scale plate body 41 is provided with scale (not shown) extending along its length direction. As shown in FIG. 1, since the length direction of the scale plate body 41 and the length direction of the conveying roller 1 are each perpendicular to the first regulating plate 31 and the second regulating plate 32, and the length direction of the scale plate body 41 is parallel to the length direction of the conveying roller 1, the scale marked in the length direction of the conveying roller 1 can measure displacement of the first regulating plate 31 and the second regulating plate 32 in the length direction of the conveying roller 1. Therefore, according to the regulation jig provided by the present invention, the distance between the lines, into which the conveying rings 2 having the same sequence are arranged, can be accurately controlled, and in turn the conveying rings 2 on two adjacent lines (rows) can be spaced at an equal interval. The linear arrangement of the conveying rings 2 having the same sequence and the equal interval between the conveying rings 2 on two adjacent lines (rows) can further ensure that the transmission surface formed by the conveying rings 2 for supporting and conveying the display substrates has a good flatness, thereby preventing the display substrates from deviating from its travelling direction during the transmission and in turn guaranteeing the normal transmission of the display substrate.

Although the scale plate body 41 is of the rectangular shape in this embodiment, it should be understood that the scale plate body 41 may be of any other shapes, such as ellipse. In the case of the ellipsoid scale plate body 41, the long axis of the ellipse is preferably perpendicular to the conveying roller 1.

In this embodiment, a strip-shaped opening 410 is formed in the scale plate body 41. The opening 410 may be extended along the length direction of the scale plate body 41. In addition, the regulation jig of the present invention may further include limiting devices 42. The limiting devices 42 are provided on the top plate surfaces of the first regulating plate 31 and the second regulating plate 32, respectively, and penetrate through the opening 410. The limiting devices 42 may cooperate with the opening 410, such that the first regulating plate 31 and the second regulating plate 32 can move in the length direction of the opening 410 (i.e., the length direction of the conveying roller 1) with respect to the scale plate body 41. The arrangement of the opening 410 and the limiting devices 42 may facilitate accurately regulating the distance between the first regulating plate 31 and the second regulating plate 32, thereby accurately regulating the interval between conveying rings 2 on two adjacent lines (rows).

In a preferred embodiment of the present invention, the limiting device 42 may be a screw bolt which comprises a screw cap and a threaded rod. As shown in FIGS. 1-3, a diameter of the rod is smaller than a width of the opening 410, and the width of the opening 410 is smaller than a diameter of the screw cap, such that the scale plate body 41 may be kept between the regulation part 3 and the screw cap. In this embodiment, bolt holes may be formed on the second plate surfaces (top plate surfaces) 312 of the first regulating plate 31 and the second regulating plate 32, to which the rods may be fit, such that the screw bolts may be vertically moved by being screwed. In such a manner, when it is desired to move the first regulating plate 31 and/or the second regulating plate 32, the screw bolt may be unscrewed, such that the first regulating plate 31 and the second regulating plate 32 can be moved in the length direction of the conveying roller 1 with respect to the scale plate body 41. When it is desired to fix the first regulating plate 31 and the second regulating plate 32, the screw bolt may be screwed tightly, such that the first regulating plate 31 and the second regulating plate 32 are fastened to scale plate body 41. At this time, the first regulating plate 31 and the second regulating plate 32 cannot move with respect to the scale plate body 41.

It should be noted that the limiting device 42 is not limited to the screw bolt. For example, the limiting devices may include threaded rods which are formed integrally with the first regulating plate 31 and the second regulating plate 32, respectively, and the scale plate body 41 may be fastened to the first regulating plate 31 and the second regulating plate 32 by screwing nuts. In other embodiments, the limiting device may be other device which is configured to restrict movement of the first regulating plate 31 and the second regulating plate 32 to the length direction of the conveying roller 1.

In other embodiments, a second strip-shaped opening (not shown) may be formed in the scale plate body 41. The second strip-shaped opening is in parallel with the first opening 410. Both strip-shaped openings may cooperate with the limiting devices 42 in the manner as described above. As a result, the first regulating plate 31 and/or the second regulating plate 32 may more stably move in the length direction of the conveying roller 1, so as to more accurately regulate the interval between the lines, into which the conveying rings 2 having the same sequence are arranged.

In this embodiment, the first regulating plate 31 and the second regulating plate 32 may be made of a rubber material. The rubber material has anti-static, water-proof and wear resistant properties. The first regulating plate 31 and the second regulating plate 32 made of the rubber material can avoid the generation of static electricity during the regulation of the conveying rings 2, thereby preventing the display substrates being conveyed from being damaged due to the static electricity. In addition, the first regulating plate 31 and the second regulating plate 32 made of the rubber material has a relatively long service life.

The process of regulating the conveying rings 2 by using the regulation jig as described above are as follows: as shown in FIGS. 4-7, mounting the regulation jig on the conveying rollers 1, such that the conveying rollers 1 are accommodated in the recesses 311 of the regulation jig; with reference to the first regulating plate 31, keeping the position of the first regulating plate 31 fixed, unscrewing the limiting device 42 (in this embodiment, the screw bolt) corresponding to the second regulating plate 32, and moving the second regulating plate 32 far away from the first regulating plate 31 in the length direction of the conveying roller 1, such that the conveying rings 2 around different conveying rollers 1 and having the same sequence, which are brought into contact with the outer plate surface of the second regulating plate 32, are arranged into a line; then, screwing tightly the screw bolt corresponding to the second regulating plate 32 to fasten the second regulating plate 32 to the scale plate body 41; with reference to the second regulating plate 32, keeping the position of the second regulating plate 32 fixed, unscrewing the limiting device 42 (in this embodiment, the screw bolt) corresponding to the first regulating plate 31, and moving the first regulating plate 31 far away from the second regulating plate 32 in the length direction of the conveying roller 1, such that the conveying rings 2 around different conveying rollers 1 and having the same sequence, which are brought into contact with the outer plate surface of the first regulating plate 31, are arranged into a line; subsequently, regulating the distance between the first regulating plate 31 and the second regulating plate 32, so as to regulate the distance between a row of the conveying rings 2 in contact with the first regulating plate 31 and a row of conveying rings 2 in contact with the second regulating plate 32. Remaining conveying rings 2 may be regulated in above manner, until all the conveying rings 2 having the same sequence are arranged into lines and the conveying rings 2 on two adjacent lines (rows) are being spaced at an equal interval.

The regulation jig according to the present invention has following advantages: the regulation part and the scale plate of the regulation jig provided by the present invention can arrange a plurality of conveying rings having the same sequence into a line with one regulation. Therefore, not only can the straightness of a row of conveying rings around different conveying rollers and having the same sequence be guaranteed, but the conveying rings on two adjacent lines (rows) can also be spaced at an equal interval, whereby guaranteeing that the transmission surface formed by the conveying rings for supporting and conveying the display substrates has a good flatness, and in turn preventing the display substrates from deviating from its travelling direction during the transmission. As such, the regulation jig provided by the present invention can efficiently and promptly regulate the positions of the conveying rings, so as to ensure the normal transmission of the display substrate.

As another aspect, there is provided a display substrate conveyer, which includes the regulation jig as set forth above.

With above regulation jig, the display substrate conveyer provided by the present invention not only can ensure that the transmission surface for supporting and conveying the display substrates has a good flatness, but also can improve the efficiency of transmission.

It could be understood that the above implementations are merely exemplary implementations for the purpose of illustrating the principle of the present invention, and the present invention is not limited thereto. Various modifications and improvements can be made by a person having ordinary skill in the art without departing from the spirit and essence of the present invention. Accordingly, these modifications and improvements also fall into the protection scope of the present invention.

The invention claimed is:

1. A regulation jig used in a conveyer for conveying a display substrate, which is capable of detachably mounting on conveying rollers and regulating one or more columns of conveying rings around conveying rollers, wherein
the regulation jig includes a regulation part and a scale plate, which are movably connected to each other,
the regulation part is configured to simultaneously regulate positions of a plurality of conveying rings having the same sequence, such that the conveying rings around different conveying rollers and having the same sequence are arranged into a line, and
the scale plate is configured to accurately control the distance between the lines, into which the conveying rings are arranged.

2. The regulation jig according to claim 1, wherein
the regulation part includes a first regulating plate and a second regulating plate which are oppositely arranged to be parallel to each other,
outer plate surfaces of the first regulating plate and the second regulating plate are configured to contact with the conveying rings around different conveying rollers and having the same sequence, respectively, and
both of the first regulating plate and the second regulating plate are movable in a length direction of the conveying roller.

3. The regulation jig according to claim 2, wherein
the conveying rollers have the same shape and size and are arranged in parallel at an equal interval,
the first regulating plate and the second regulating plate are arranged to be perpendicular to the length direction of the conveying roller, such that their first plate surfaces facing to the conveying rollers are brought into contact with the conveying rollers, and
the first plate surfaces are capable of simultaneously contacting with a plurality of conveying rollers.

4. The regulation jig according to claim 3, wherein
a plurality of recesses are formed on the first plate surface, and
the plurality of recesses have the same shape and size, so as to cooperate with the plurality of conveying rollers, respectively.

5. The regulation jig according to claim 4, wherein
the conveying roller is of a cylindrical shape, the recess is of a semicircular, and a diameter of the recess is equal to or slightly larger than that of the conveying roller.

6. The regulation jig according to claim 5, wherein
the scale plate include a scale plate body,
the scale plate body is provided on second plate surfaces of the first regulating plate and the second regulating plate, which are opposite to the first plate surfaces,
a length direction of the scale plate body is perpendicular to the first regulating plate and the second regulating plate,
the length of the scale plate body in a direction perpendicular to the first regulating plate and the second regulating plate is larger than a sum of thicknesses of the first regulating plate and the second regulating plate, and
a top plate surface of the scale plate body is provided with scale extending along its length direction.

7. The regulation jig according to claim 6, wherein
at least one strip-shaped opening is formed in the scale plate body, the opening being extended along the length direction of the scale plate body,
the regulation jig further includes limiting devices, which are provided on the second plate surfaces of the first regulating plate and the second regulating plate, respectively, and penetrate through the opening, and
the limiting devices are capable of cooperating with the opening, such that the first regulating plate and the second regulating plate are movable in the length direction of the opening with respect to the scale plate body.

8. The regulation jig according to claim 7, wherein
the limiting device is a screw bolt, which comprises a screw cap and a threaded rod,
a diameter of the rod is smaller than a width of the opening, and the width of the opening is smaller than a diameter of the screw cap, such that the scale plate body is kept between the regulation part and the screw cap, and
bolt holes are formed on the second plate surfaces of the first regulating plate and the second regulating plate, to which the rods are fit.

9. The regulation jig according to claim 7, wherein
the limiting devices include threaded rods which are formed integrally with the first regulating plate and the second regulating plate and which are capable of cooperating with nuts, and
a diameter of the rod is smaller than a width of the opening, and the width of the opening is smaller than a diameter of the nuts, such that the scale plate body is kept between the regulation part and the nuts.

10. The regulation jig according to claim 2, wherein
the first regulating plate and the second regulating plate are made of a rubber material.

11. A display substrate conveyer, wherein
the display substrate conveyer includes the regulation jig according to claim 1.

12. The display substrate conveyer according to claim 11, wherein
the regulation part includes a first regulating plate and a second regulating plate which are oppositely arranged to be parallel to each other,
outer plate surfaces of the first regulating plate and the second regulating plate are configured to contact with the conveying rings around different conveying rollers and having the same sequence, respectively, and
both of the first regulating plate and the second regulating plate are movable in a length direction of the conveying roller.

13. The display substrate conveyer according to claim 12, wherein the conveying rollers have the same shape and size and are arranged in parallel at an equal interval, the first regulating plate and the second regulating plate are arranged to be perpendicular to the length direction of the conveying roller, such that their first plate surfaces facing to the conveying rollers are brought into contact with the conveying rollers, and the first plate surfaces are capable of simultaneously contacting with a plurality of conveying rollers.

14. The display substrate conveyer according to claim 13, wherein a plurality of recesses are formed on the first plate surface, and the plurality of recesses have the same shape and size, so as to cooperate with the plurality of conveying rollers, respectively.

15. The display substrate conveyer according to claim 14, wherein the conveying roller is of a cylindrical shape, the recess is of a semicircular shape, and a diameter of the recess is equal to or slightly larger than that of the conveying roller.

16. The display substrate conveyer according to claim 15, wherein the scale plate includes a scale plate body, and the scale plate body is provided on second plate surfaces of the first regulating plate and the second regulating plate, which are opposite to the first plate surfaces, a length direction of the scale plate body is perpendicular to the first regulating plate and the second regulating plate, the length of the scale plate body in a direction perpendicular to the first regulating plate and the second regulating plate is larger than a sum of thicknesses of the first regulating plate and the second regulating plate, and a top plate surface of the scale plate body is provided with scale extending along its length direction.

17. The display substrate conveyer according to claim 16, wherein at least one strip-shaped opening is formed in the scale plate body, the opening being extended along the length direction of the scale plate body, the regulation jig further includes limiting devices, which are provided on the second plate surfaces of the first regulating plate and the second regulating plate, respectively, and penetrate through the opening, and the limiting devices are capable of cooperating with the opening, such that the first regulating plate and the second regulating plate are movable in the length direction of the opening with respect to the scale plate body.

18. The display substrate conveyer according to claim 17, wherein the limiting device is a screw bolt, which comprises a screw cap and a threaded rod, a diameter of the rod is smaller than a width of the opening, and the width of the opening is smaller than a diameter of the screw cap, such that the scale plate body is kept between the regulation part and the screw cap, and bolt holes are formed on the second plate surfaces of the first regulating plate and the second regulating plate, to which the rods are fit.

19. The display substrate conveyer according to claim 17, wherein the limiting devices include threaded rods which are formed integrally with the first regulating plate and the second regulating plate and which are capable of cooperating with nuts, and a diameter of the rod is smaller than a width of the opening, and the width of the opening is smaller than a diameter of the nuts, such that the scale plate body is kept between the regulation part and the nuts.

20. The display substrate conveyer according to claim 12, wherein the first regulating plate and the second regulating plate are made of a rubber material.

* * * * *